(12) United States Patent
Jensen

(10) Patent No.: US 7,764,934 B2
(45) Date of Patent: Jul. 27, 2010

(54) RF TRANSCEIVER INCORPORATING DUAL-USE PLL FREQUENCY SYNTHESIZER

(75) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/541,765

(22) Filed: Aug. 14, 2009

(65) Prior Publication Data
US 2009/0311978 A1    Dec. 17, 2009

Related U.S. Application Data

(63) Continuation of application No. 11/080,207, filed on Mar. 15, 2005, now Pat. No. 7,593,695.

(51) Int. Cl.
*H04B 1/02*    (2006.01)
(52) U.S. Cl. .................. 455/91; 455/76; 455/102; 455/118; 455/165.1; 455/183.1

(58) Field of Classification Search .............. 455/23, 455/42, 76, 91, 102, 118, 165.1, 183.1, 205, 455/260
See application file for complete search history.

(56) References Cited

U.S. PATENT DOCUMENTS

2005/0047523 A1* 3/2005 Shiung ..................... 375/307
2005/0124351 A1* 6/2005 Black et al. ............... 455/452.2
2005/0186920 A1* 8/2005 Staszewski et al. ....... 455/114.1

* cited by examiner

*Primary Examiner*—Tuan A Pham
(74) *Attorney, Agent, or Firm*—Garlick Harrison & Markison; Holly L. Rudnick

(57) ABSTRACT

A frequency synthesizer for use in a transmitter operates to receive outbound transmit data and to modulate the outbound transmit data to produce a modulated RF signal. The modulated RF signal can then be amplified to produce an outbound RF signal.

18 Claims, 11 Drawing Sheets

RF TRANSCEIVER INCORPORATING DUAL-USE PLL FREQUENCY SYNTHESIZER

CROSS-REFERENCE TO RELATED APPLICATIONS

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

1. U.S. Utility application Ser. No. 11/080,207, entitled "RF Transceiver Incorporating Dual-Use PLL Frequency Synthesizer," filed Mar. 15, 2005, pending.

BACKGROUND

1. Technical Field

The present invention relates to wireless communications and, more particularly, wideband wireless communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switch telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals. A filtering stage filters the low IF signals to attenuate unwanted out of band signals to produce a filtered signal. The data recovery stage demodulates the filtered signal to recover the raw data in accordance with the particular wireless communication standard.

As is also known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna. In certain RF transceivers, the transmitter may be implemented as a translational loop transmitter.

A translational loop transmitter may include a digital processor, digital to analog converter (DAC), low pass filter, and a phase locked loop (PLL). The digital processor, in general, produces a digital version of the desired RF spectrum at some intermediate frequency (e.g., 26 MHz for GSM). The DAC converts the digital signals into the analog domain, which are subsequently filtered by the low pass filter. The translational loop translates the frequency of the analog signals outputted by the low pass filter to the desired radio frequencies. Specifically, a mixer in the feedback path of the translational loop uses an RF reference signal provided by a PLL frequency synthesizer to perform this "translation" of the IF signal to the desired RF frequency.

Thus, in a typical conventional RF transceiver architecture, the transmitter is designed around a translational loop where a separate PLL frequency synthesizer provides an RF frequency signal to the translational loop. In the receive mode, the PLL frequency synthesizer provides the RF frequency to the receiver. However, translational loops are expensive, consume large amounts of power and occupy a large amount of die space in RF transceivers. Therefore, what is needed is a low power and minimum cost RF transceiver architecture that operates using a conventional PLL frequency synthesizer in both a transmitting mode for generating the transmitted signals and a receiving mode for generating the local oscillations mixed with the received signals.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
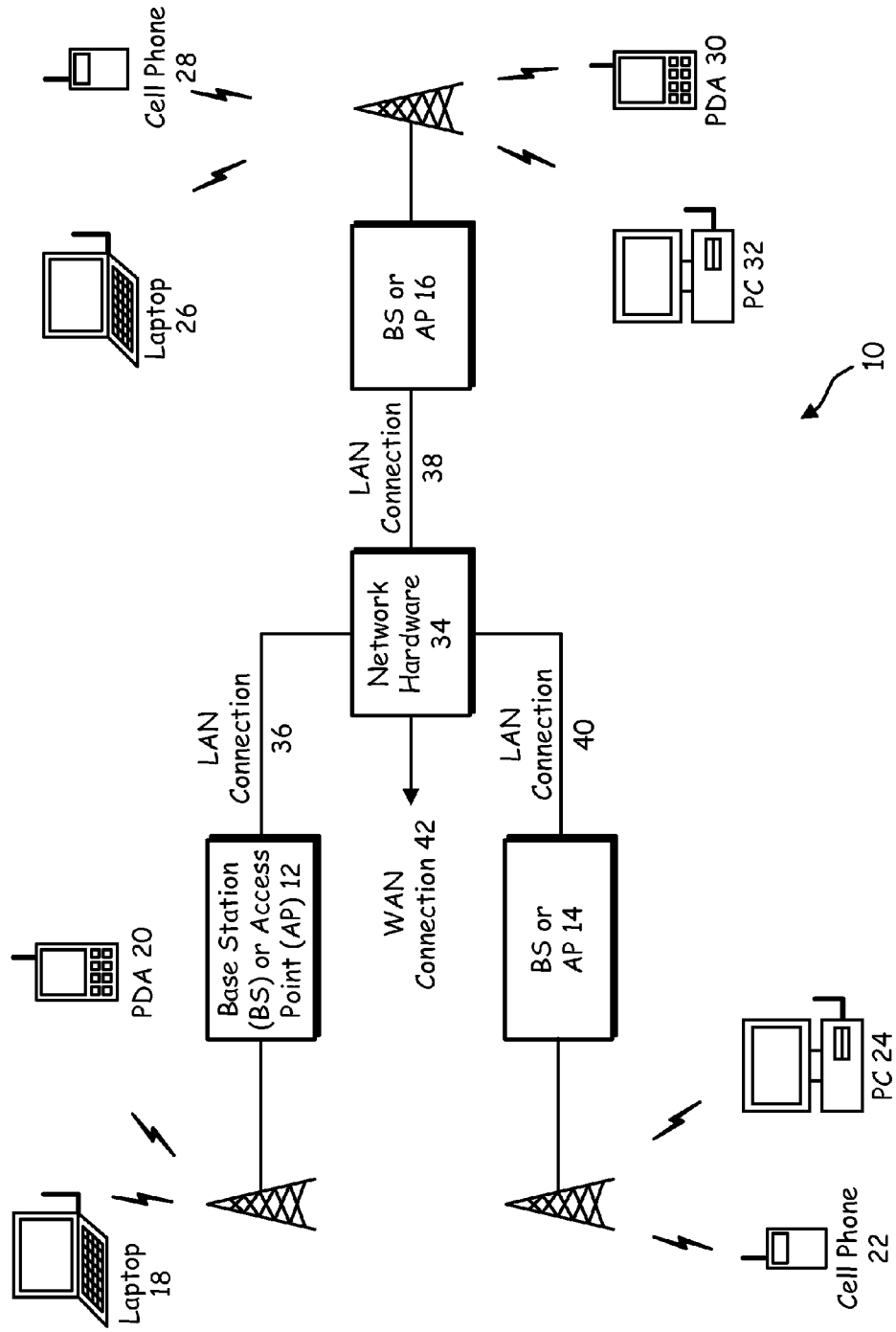
FIG. 1 is a functional block diagram illustrating a communication system that includes a plurality of base stations or access points (APs), a plurality of wireless communication devices and a network hardware component.

FIG. 1 is a functional block diagram illustrating a communication system 10 that includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to FIGS. 2-9.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. For example, access points are typically used in Bluetooth systems. Regardless of the particular type of communication system, each wireless communication device and each of the base stations or access points includes a built-in radio and/or is coupled to a radio. The radio includes a transceiver (transmitter and receiver) for modulating/demodulating information (data or speech) bits into a format that comports with the type of communication system.

Figure 2:
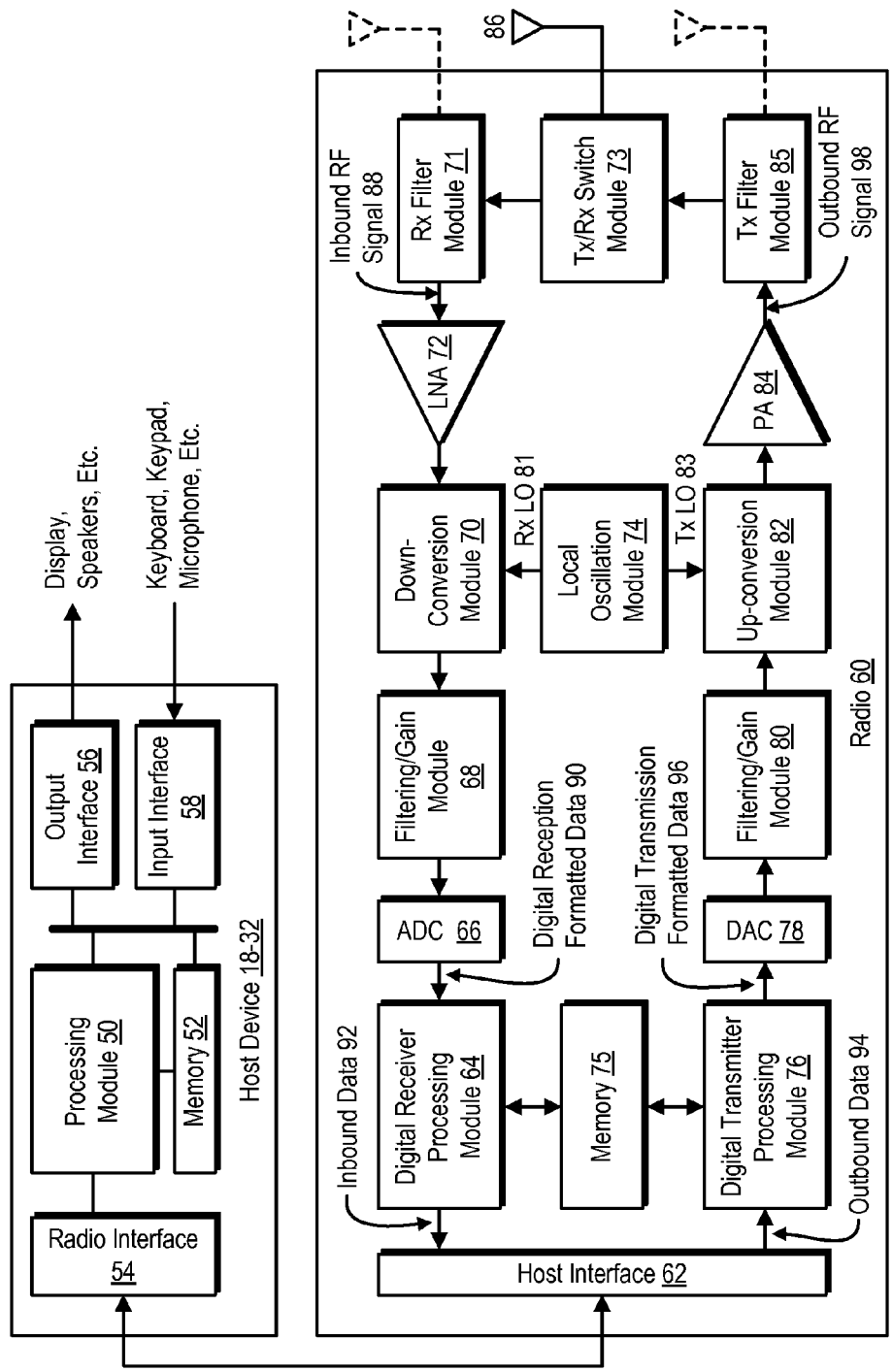
FIG. 2 is a schematic block diagram illustrating a wireless communication device as a host device and an associated radio.

FIG. 2 is a schematic block diagram illustrating a wireless communication device 18-32 as a host device and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host wireless communication device 18-32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a low noise amplifier 72, receiver filter module 71, a transmitter/receiver (Tx/RX) switch module 73, a local oscillation module 74, a memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, modulation. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18-32 via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation 83 provided by local oscillation module 74. The power amplifier 84 amplifies the RF signal to produce an outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. The down-conversion module 70 provides the inbound low IF signal or baseband signal to the filtering/gain module 68.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18-32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver processing module 64 and the digital transmitter processing module 76 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

The wireless communication device of FIG. 2 is one that may be implemented to include either a direct conversion from RF to baseband and baseband to RF or for a conversion by way of a low intermediate frequency. In either implementation, however, for an up-conversion module 82 and a down-conversion module 70, it is required to provide accurate frequency conversion. For the down-conversion module 70 and up-conversion module 82 to accurately mix a signal, however, it is important that the local oscillation module 74 provide an accurate local oscillation signal for mixing with the baseband/IF or RF by the up-conversion module 82 and down-conversion module 70, respectively. Accordingly, the local oscillation module 74 includes circuitry for adjusting an output frequency of a local oscillation signal provided therefrom.

In prior art radios 60 that use phase locked loop (PLL) frequency synthesizers as the local oscillation module 74 to produce the local oscillations mixed with the transmitted and received signals, the transmitter typically includes a translational loop that uses the RF frequency of the PLL frequency synthesizer to "translate" the signal from an IF to the desired RF frequency, using a mixer. However, as discussed above, translational loops are expensive, consume large amounts of power and occupy a large amount of die space in RF transceivers.

Therefore, in accordance with embodiments of the present invention, the radio 60 can incorporate a dual-use PLL frequency synthesizer, thereby eliminating the translational loop of prior art transceivers, resulting in substantial die area savings. In one mode, when the radio 60 operates as a receiver, the PLL frequency synthesizer provides the RF carrier for the receiver. In the other mode, when the radio 60 operates as a transmitter, modulation is added to the PLL frequency synthesizer output, and hence the PLL frequency synthesizer operates as a transmitter.

Figure 3:
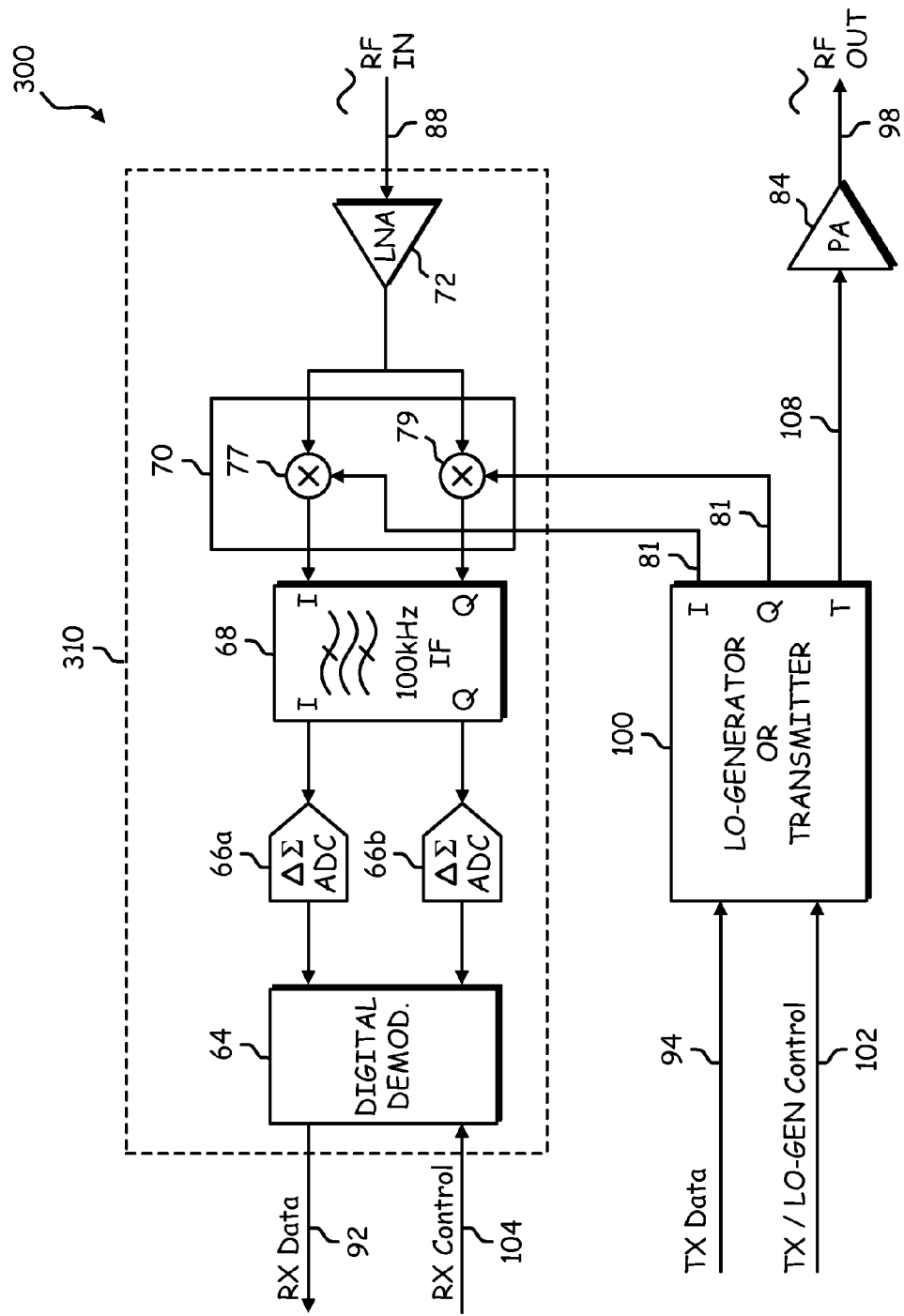
FIG. 3 is a schematic block diagram illustrating an exemplary constant envelope radio transceiver incorporating a dual-use PLL frequency synthesizer, in accordance with embodiments of the present invention.

FIG. 3 is a schematic block diagram of an exemplary RF transceiver 300 incorporating a dual-use PLL frequency synthesizer 100, in accordance with embodiments of the present invention. The RF transceiver 300 includes a receiver 310 and a dual-use PLL frequency synthesizer 100, labeled "LO-Generator or Transmitter." The dual-use PLL frequency synthesizer 100 operates as either LO-generator for the receiver in a receiving mode or as a transmitter in a transmitting mode.

The receiver 310 includes the low noise amplifier (LNA) 72, down-conversion module 70, complex bandpass filter 68, a pair of high dynamic range delta-sigma (ΔΣ) analog-to-digital converters 66a and 66b and the digital demodulator 64. In receiving mode, the LNA 72 amplifies the inbound RF signal 88 to produce an amplified inbound RF signal. The LNA 72 provides the amplified inbound RF signal to the down-conversion module 70, which directly converts the amplified inbound RF signal into an inbound low IF signal or baseband signal based on receiver local oscillation signals 81 provided by the dual-use PLL frequency synthesizer 100. The down-conversion module 70 includes a pair of mixers 77 and 79 for down-converting the amplified inbound RF signal into inbound low IF or baseband in-phase (I) and quadrature-phase (Q) signals, respectively, using cosine and sine reference RF signals 81 provided by the dual-use PLL frequency synthesizer 100.

The mixers 77 and 79 provide the I and Q signals to the complex bandpass filter 68, which filters the I and Q signals to provide filtered I and Q signals. The filtered I and Q signals are converted from analog to digital via the high dynamic range delta-sigma (ΔΣ) analog-to-digital converters 66a and 66 to produce respective digital signals. The digital demodulator demodulates the digital signals and extracts the digital transmit data.

In transmitting mode, the dual-use PLL frequency synthesizer 100 receives outbound transmit data 94 and modulates the outbound transmit data 94 to produce a modulated RF signal 108. The power amplifier 84 amplifies the modulated RF signal 108 to produce the outbound RF signal 98. In one embodiment, the dual-use PLL frequency synthesizer 100 is capable of operating in either the receiving mode or in the transmitting mode, but not in both modes simultaneously. Therefore, a control signal 102 is provided to the PLL frequency synthesizer 100 to select between the transmitting mode and the receiving mode. In addition, a control signal 104 is provided to the receiver 310 to activate the receiver 310 in the receiving mode.

Figure 4:
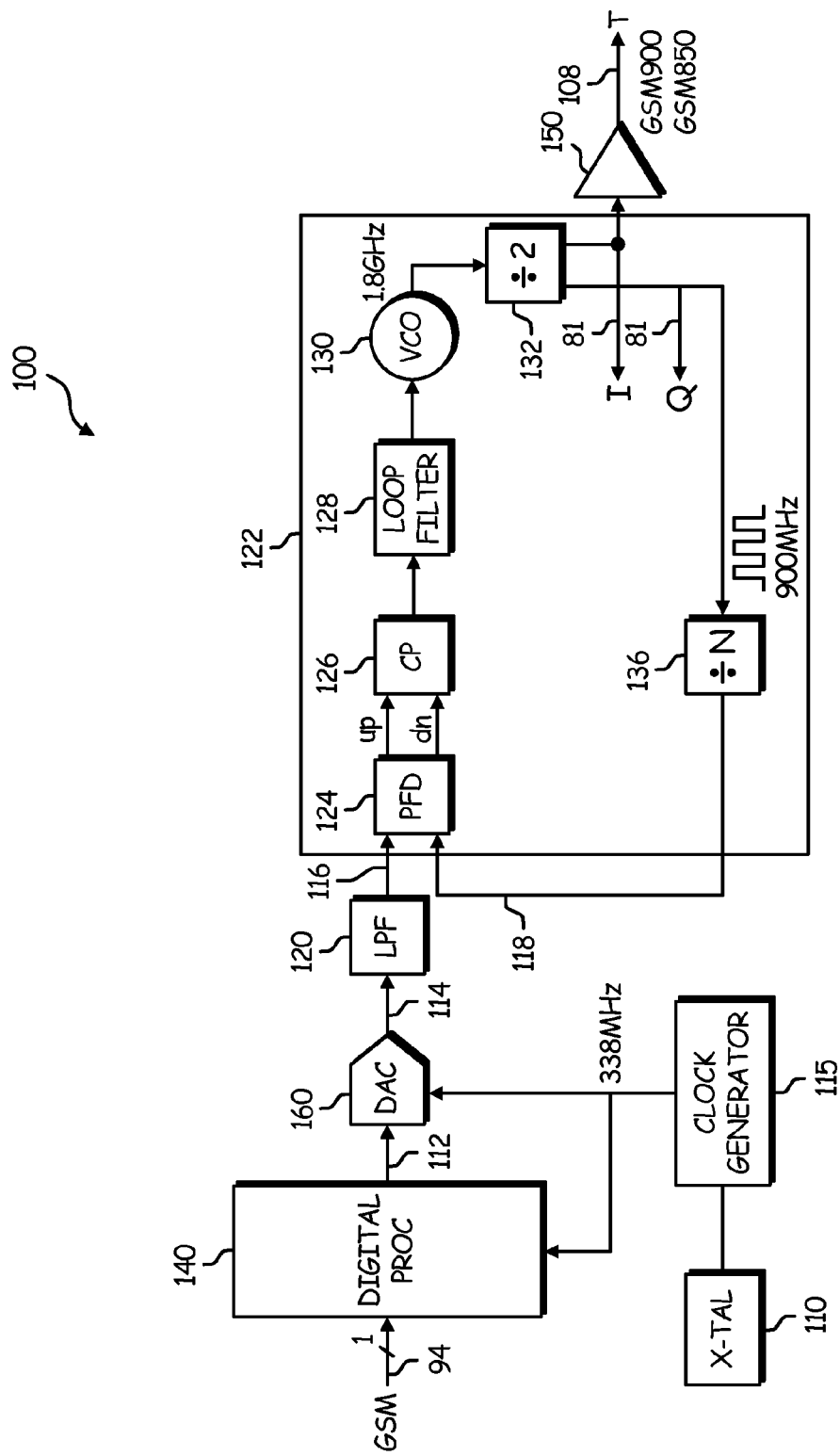
FIG. 4 is a schematic block diagram of an exemplary dual-use PLL frequency synthesizer in accordance with embodiments of the present invention.

FIG. 4 is a schematic block diagram of an exemplary dual-use PLL frequency synthesizer 100 in accordance with embodiments of the present invention. The dual-use PLL frequency synthesizer 100 includes a digital processor 140, digital-to-analog converter (DAC) 160, low pass filter (LPF) 120, a phase locked loop (PLL) 122 and a power amplifier 150. In transmitting mode, the digital baseband data 94 enters the digital processor 140, which performs the necessary pulse shaping and modulation to some intermediate frequency (IF) carrier $f_{IF}$. The resulting digital signal 112 is a modulated digital signal that is converted to an analog signal 114 by the DAC 160. The LPF 120 filters out undesired digital images of the IF signal. The PLL 122 then translates the filtered IF signal 116 to the desired RF frequency and the power amplifier 150 delivers the modulated RF signal 108 to the antenna.

In receiving mode, the digital processor 140 generates the digital signal 112 as a digital reference signal at a reference frequency appropriate for providing an accurate local oscillation signal for mixing with the inbound RF signal in the receiver. The digital signal 112 is converted to an analog signal 114 by the DAC 160, and the LPF 120 filters out undesired digital images of the IF signal. The PLL 122 again translates the filtered IF signal 116 to the desired RF frequency and delivers the reference RF signal (I and Q local oscillation signals) 81 to the receiver.

The PLL 122 includes a phase and frequency detector (PFD) 124, a charge pump (CP) 126, a lowpass loop filter (LPF) 128, a voltage controlled oscillator (VCO) 130, and several divider blocks 132 and 136 in the feedback path that each divide the incoming signal by some integer. The fixed divide-by-2 block 132 allows the PLL frequency synthesizer 100 to easily generate in-phase (I) and quadrature (Q) carrier signals in the GSM bands around 850 MHz and 900 Mhz by tuning the VCO 130 appropriately around 3.6 GHz. In receiving mode, the I and Q carrier (RF) signals 81 are input to the receiver as local oscillation signals, while in transmitting mode, the output of the divide-by-2 block 132 is input to the power amplifier 150 to deliver the modulated RF signal 108 to the antenna. The multi-modulus divide-by-N divider 136 in the feedback path enables a feedback signal 118 to "lock" to the filtered IF signal 116.

A qualitative description of the receiving mode operation of the PLL frequency synthesizer 100 of the present invention is as follows. The digital processor 140 generates a digital reference signal 112 tuned around 20-40 MHz (but no greater than half the clock frequency of 338 MHz), which is converted to a reference analog signal 114 by DAC 160. The DAC 160 operates at a high sampling rate so as to ensure adequate attenuation of digital images via the lowpass filter 120 prior to being input to the PFD 124 of the PLL 122. The reference analog signal 114 is filtered by LPF 120 to produce a filtered reference analog signal 116 to the reference input of the PFD 124. The output of the PFD 124 is an error signal (in phase and/or frequency) between the filtered reference analog signal 116 and a feedback signal 118. The charge pump 126 responds to the (UP,DN) control signals of the PFD 124 by either "pumping" current into the loop filter 128 or moving current out of the loop filter 128 and "pumping" it into ground. The current pulses of the CP 126 are filtered by the loop filter 128 thereby generating a smooth output voltage referred to as the "control voltage", $v_{ctrl}$.

The oscillation frequency of the VCO 130 of the PLL 122 is determined by the control voltage, $v_{CTRL}$, supplied by the loop filter 128. The VCO 130 oscillation is input to the fixed divide-by-two block 132 to produce the reference RF signal 81 for transmission to the down-conversion module of the receiver. The divider block 136 is coupled to receive the output of the divide-by-two block 132 and to divide the output by a constant divide ratio to produce the analog feedback signal 118 input to the PFD 124.

Fine frequency tuning is provided by finely tuning the reference signal via the digital processor 140. The DC gain of the PLL frequency synthesizer 100 is equal to N so a change of Δf in the reference frequency results in a change of the product of N and Δf at the VCO 130 output. Conversely, changing the divider N 136 by 1 changes the frequency of the reference RF signal 81 by an amount equal to the frequency of the filtered reference analog signal 116.

A qualitative description of the transmitting mode operation of the PLL frequency synthesizer 100 of the present invention is as follows. The digital processor 140 receives the digital baseband data 94 and performs the necessary pulse shaping and modulation to produce the modulated digital signal (e.g., an intermediate frequency (IF) carrier $f_{IF}$), which is converted to a modulated analog signal 114 by DAC 160. The modulated digital signal 114 is filtered by LPF 120 to produce a filtered modulated digital signal 116 to the reference input of the PFD 124. The output of the PFD 124 is an error signal (in phase and/or frequency) between the filtered modulated analog signal 116 and a feedback signal 118. The charge pump 126 responds to the (UP,DN) control signals of the PFD 124 by either "pumping" current into the loop filter 128 or moving current out of the loop filter 128 and "pumping" it into ground. The current pulses of the CP 126 are filtered by the loop filter 128 thereby generating a smooth output voltage referred to as the "control voltage", $v_{ctrl}$.

The oscillation frequency of the VCO 130 of the PLL 122 is determined by the control voltage, $v_{CTRL}$, supplied by the loop filter 128. The VCO 130 oscillation is input to the fixed divide-by-two block 132 and received and amplified by the power amplifier 150 to produce the modulated RF signal 108 for transmission to the antenna. The divider block 136 is coupled to receive the output of the divide-by-two block 132 and to divide the output by a constant divide ratio to produce the analog feedback signal 118 input to the PFD 124.

The PLL frequency synthesizer 100 further includes a precise crystal oscillator (X-TAL) 110 and a clock generator 115. The crystal oscillator provides a clock frequency to the clock generator 115, which generates a square wave clock signal and provides the clock signal to the digital processor 140 and the DAC 160. For example, in one embodiment, the clock generator 115 provides a 338 MHz clock signal to the digital processor 140 and the DAC 160.

Figure 5:
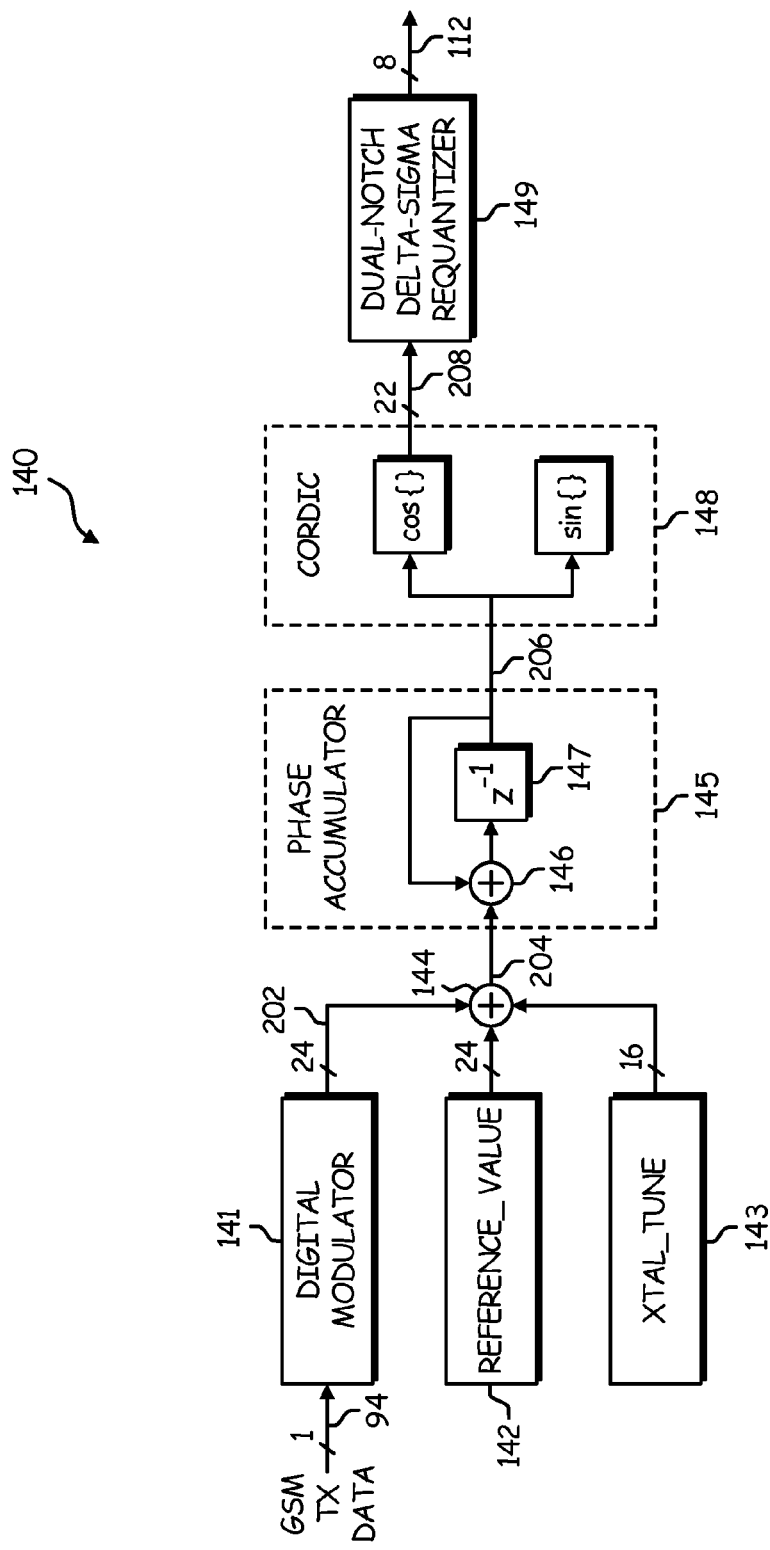
FIG. 5 is a schematic block diagram illustrating exemplary components of a digital processor for use in the PLL frequency synthesizer of the present invention.

FIG. 5 is a schematic block diagram illustrating exemplary components of a digital processor 140 for use in the PLL frequency synthesizer of the present invention. The processor 140 shown in FIG. 5 including a register programmable with a variable frequency value 142 that determines the frequency of the reference signal (e.g., 20-40 MHz). An additional register is programmable with a constant tuning value 143 in order to compensate for inaccuracies in the crystal reference frequency provided by X-TAL 110 (shown in FIG. 4). A digital modulator 141 is operable to receive the digital baseband data 94 in the transmitting mode and perform the necessary pulse shaping and modulation to produce modulated digital data 202. The modulated digital data 202, reference frequency value 142 and the tuning value 143 are input to a summing node 144 that combines the modulated digital data, reference frequency value 142 and the tuning value 143 to produce combined signal 204. In receiving mode, the digital modulator 141 does not produce the modulated digital data 202, and therefore, the combined signal 204 includes only the reference frequency value 142 and any tuning value 143.

A phase accumulator 145 comprises a delay element 147 whose output is produced to a feedback loop to integrate the combined signal 204 using summation node 146. Thus, phase accumulator 145 generates a phase ramp 206 corresponding to the combined signal 204. A modulator 148 of the digital processor 210 performs the frequency modulation of the phase signal 206. For example, such modulation function may be implemented by the COordinate Rotation DIgital Computer (CORDIC) algorithm. As is known in the art, the CORDIC rotates a basis vector of the complex plane (1,0) by an amount equal to the output of the phase accumulator 145. The resulting complex number is the output of the modulator 148. Thus, modulator 148 modulates the phase signal output from the phase accumulator 145 and produces corresponding I & Q vector digital data.

The I vector digital data 208 is produced to a dual-notch Delta Sigma modulator 149 that re-quantizes the high-resolution digitally modulated signal to a coarse 8-bit signal in order to ensure that quantization noise is spectrally shaped in a favorable fashion. The output of the dual-notch re-quantizer is the digital signal 112.

Figure 6:
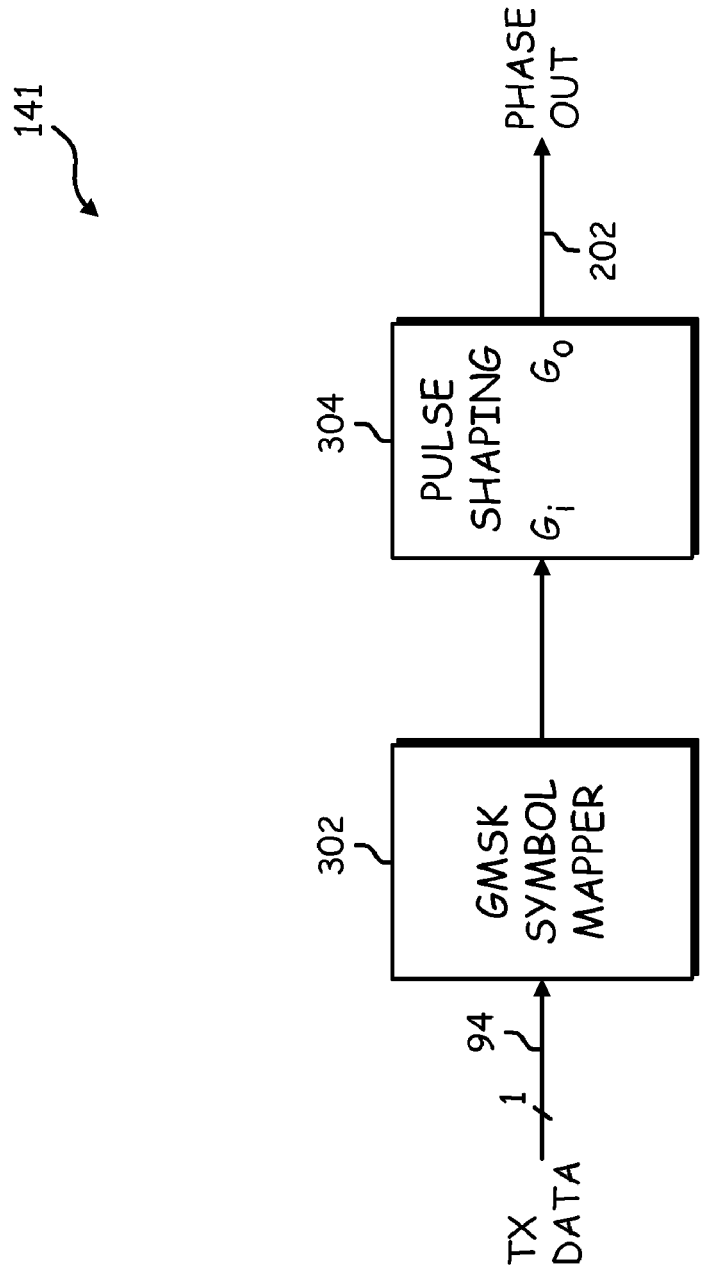
FIG. 6 is a schematic block diagram illustrating an exemplary digital modulator for use in the digital processor of the PLL frequency synthesizer of the present invention.

FIG. 6 is a schematic block diagram illustrating an exemplary digital modulator for use in the digital processor of the PLL frequency synthesizer of the present invention. The digital modulator 141 includes a symbol mapper 302 and a pulse shaping block 304. The symbol mapper 302 maps incoming data bits 94 to the symbols {+1, −1}, and the pulse shaping block 304 performs the narrowband pulse shaping filtering. For example, in Global System for Mobile Communications (GSM) applications, the filter applied for pulse shaping is a Gaussian filter with BT product of 0.30.

Figure 7:
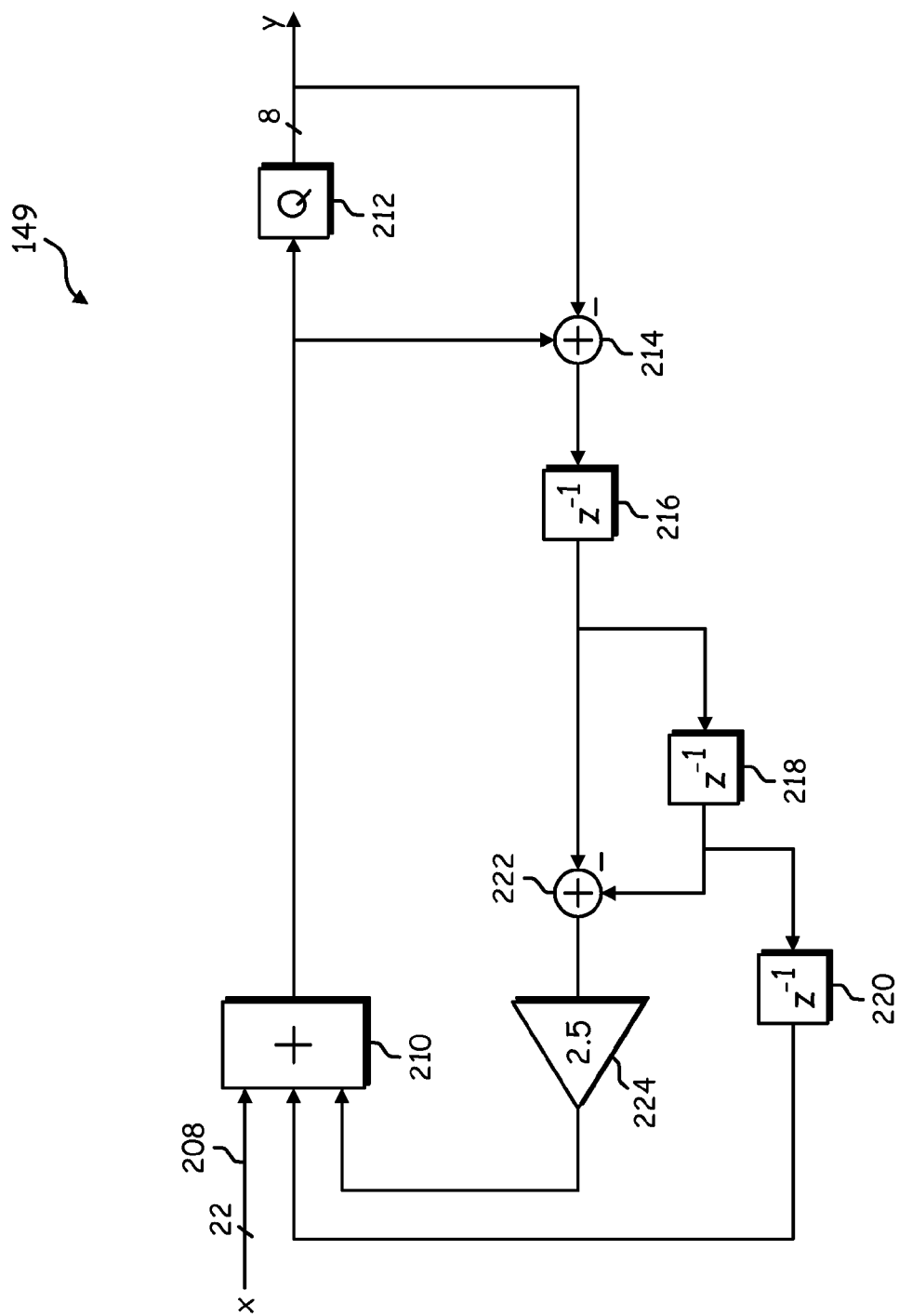
FIG. 7 is a schematic block diagram illustrating an exemplary dual-notch re-quantizer for use in the digital processor of the PLL frequency synthesizer of the present invention.

FIG. 7 is a schematic block diagram illustrating an exemplary dual-notch re-quantizer for use in the digital processor of the PLL frequency synthesizer of the present invention. The dual-notch re-quantizer 149 operates with a 22-bit input signal 208 that is quantized to an 8-bit signal 112 at the output node. Quantization is performed by a quantizer 212 that takes the 8 most significant bits (MSBs) as the output 112. A feedback loop including summation node 214, delay elements 216, 218 and 220, summation node 222 and gain 224, as shown in FIG. 7, performs the spectral shaping of the quantization noise such that the quantization noise is favorable for the operation of the synthesizer.

Figure 8:
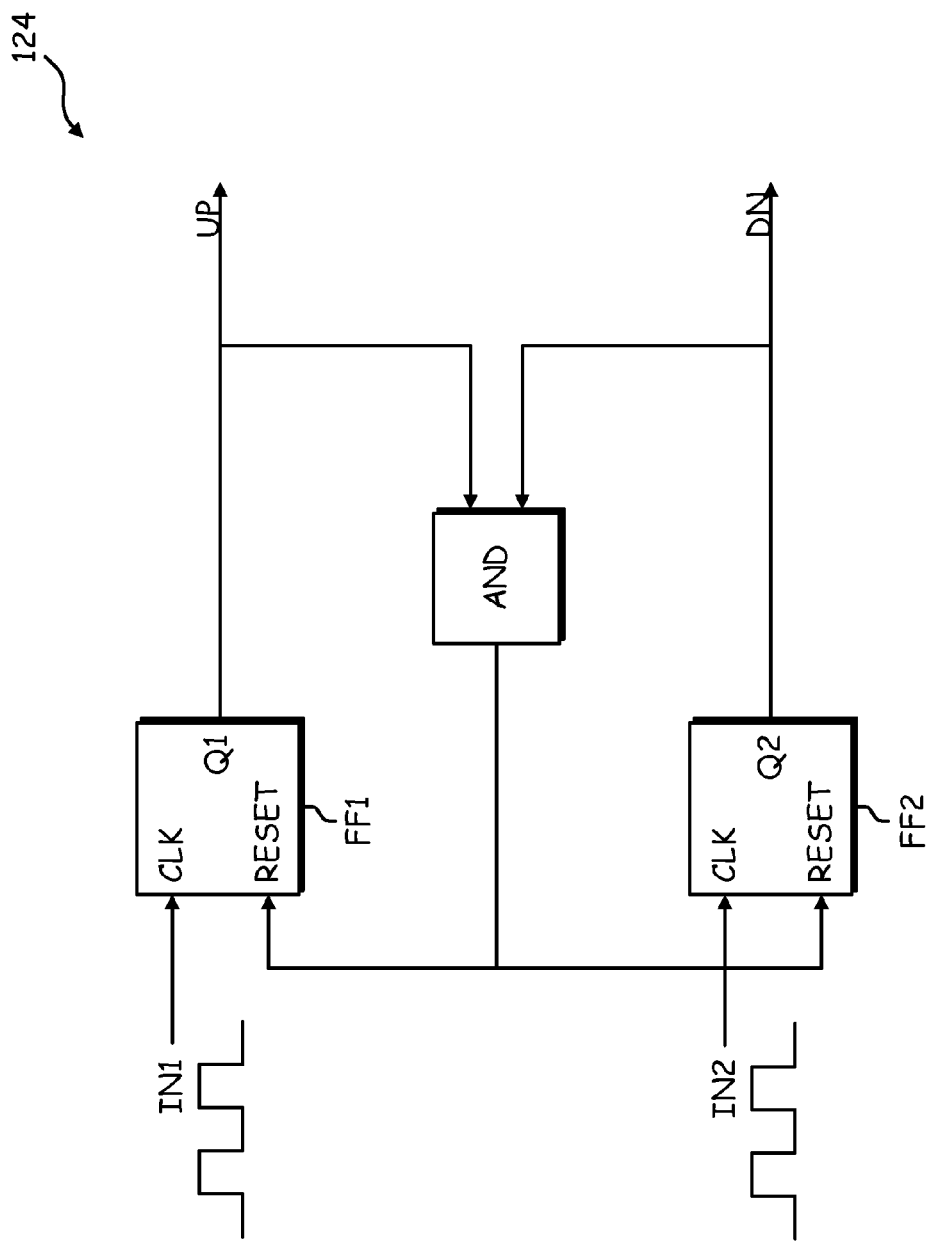
FIG. 8 is schematic block diagram illustrating an exemplary phase and frequency detector (PFD) for use in embodiments of the present invention.

FIG. 8 shows details of a typical implementation of the PFD 124. Two reset-able flip-flops FF1 and FF2 are coupled with an AND gate in a feedback loop. Assuming that the signals IN1 and IN2 are appropriate for driving digital circuitry, the operation of the PFD 124 is as follows. After reset, the outputs UP and DN are LOW, or 0. If IN1 goes HIGH, or 1, then UP goes HIGH. When IN2 goes HIGH, DN goes HIGH momentarily, resulting in a positive edge at the AND gate output. This edge resets the two flip-flops FF1 and FF2 to the initial state (UP,DN)=(0,0). Thus, any phase difference between the two signals IN1 and IN2 results in the PFD 124 residing in the state (UP,DN)=(1,0) for a duration of time proportional to the phase difference between IN1 and IN2. Similarly, any difference in frequency between IN1 and IN2 results in the PFD 124 residing in either the state (UP,DN)=(1,0) or the state (UP,DN)=(0,1), depending upon the sign of the frequency difference.

Figure 9:
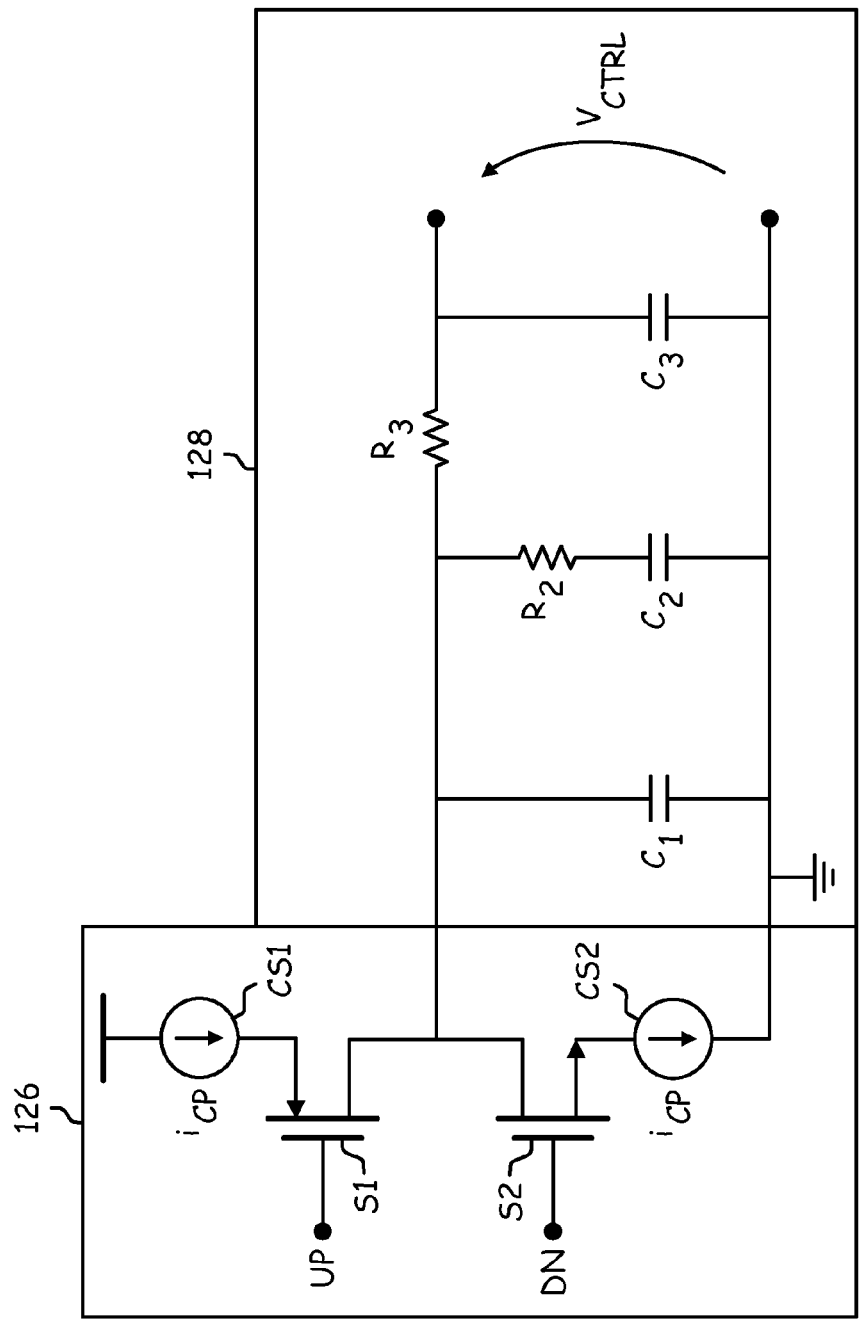
FIG. 9 is a circuit schematic illustrating an exemplary charge pump and loop filter combination for use in embodiments of the present invention.

FIG. 9 shows details of a typical implementation of the charge pump 126 and loop filter 128 combination. The charge pump 126 responds to the (UP,DN) control signals of the PFD by either "pumping" current into the loop filter 128 or moving current out of the loop filter 128 and "pumping" it into ground. The charge pump 126 includes two equally weighted current sources CS1 and CS2, each with a nominal output current $I_{CP}$, in an arrangement with two switches S1 and S2 controlled by UP and DN. Thus, it follows that the CP 126 essentially functions as an asynchronously clocked digital-to-analog converter (DAC) whose nominal output $y_{CP}(t)$ depends upon the digital inputs UP and DN such that $$y_{CP}(t) = \begin{cases} I_{CP}, & \text{if } \{UP, DN\} = \{1, 0\} \\ 0, & \text{if } \{UP, DN\} = \{1, 1\} \\ 0, & \text{if } \{UP, DN\} = \{0, 0\} \\ -I_{CP}, & \text{if } \{UP, DN\} = \{0, 1\} \end{cases}$$

The current pulses of the CP 126 are filtered by the loop filter 128 thereby generating a smooth output voltage referred to as the "control voltage", $v_{ctrl}$. The loop filter 128 typically consists of passive components, e.g., resistors R2 and R3 and capacitors C1, C2 and C3. The loop filter 128 shown in FIG. 5 is a third-order loop filter because it contains three poles.

Referring again to FIG. 4, the oscillation frequency of the VCO 130 of the PLL 122 is determined by the control voltage, $v_{CTRL}$, shown in FIG. 9. The sensitivity of the VCO 130 to changes in the control voltage is referred to as the VCO gain, denoted herein as $K_{VCO}$. This sensitivity is typically specified in MHz per Volt. For example, typical numbers for VCO gain are in the range 20 MHz/V to 50 MHz/V. In a practical setting, the VCO 130 typically undergoes "calibration" as part of the operating the PLL 122. This calibration determines the operating point of the VCO 130 and allows the VCO 130 to function over a wide range of frequencies.

The transmitter architecture shown in FIG. 4 is an example of a constant envelope communications scheme, such as that used in GSM systems. However, embodiments of the present invention are not limited to constant envelope communications schemes. For example, the modulation scheme of Enhanced Data rates for GSM Evolution (EDGE) systems is a variable envelope communications scheme.

Figure 10:
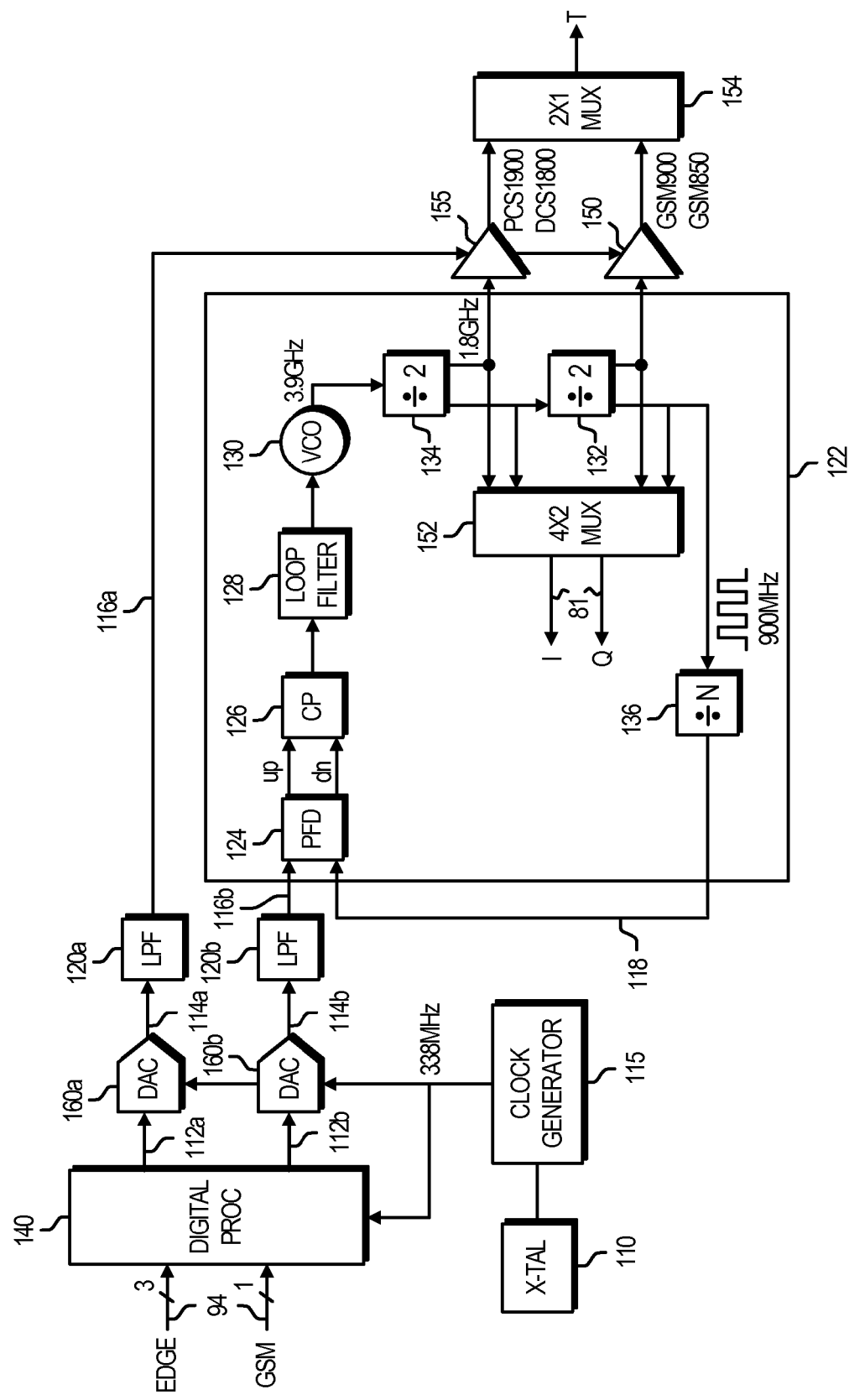
FIG. 10 is a schematic block diagram illustrating an exemplary variable envelope radio transceiver incorporating the dual-use PLL frequency synthesizer of the present invention.

FIG. 10 is a schematic block diagram illustrating an exemplary variable envelope radio transceiver incorporating the dual-use PLL frequency synthesizer of the present invention. This type of transmitter is also referred to as a polar transmitter. As can be seen from FIG. 10, the digital processor 140 splits the digital signal into an envelope component 112a and a phase component 112b. The envelope signal 112a is converted to an analog envelope signal 114a by a first DAC 160a, and the phase signal 112b is converted to an analog phase signal 112b by a second DAC 160b. The analog envelope signal is filtered by a first LPF 120a to produce a filtered analog envelope signal 116a, and the analog phase signal is filtered by a second LPF 120b to produce a filtered analog phase signal.

The PLL 122 converts the filtered analog phase signal 116b to the RF, and combines the RF signal with the filtered analog envelope signal at amplitude modulated PA's 150 and 155. Each PA 150 and 155 generates a respective signal by effectively multiplying the filtered analog envelope signal 116b with the translational loop output. In GSM (constant envelope) mode, the RF output carrier is modulated in the second PA 150 by the filtered analog envelope signal 116b, which in this case, is set to one. As such, the output of the second PA 150 while in GSM mode is in effect an unmodulated RF carrier. A 2×1 multiplexer (MUX) 154 selects between the output of the first PA 155 and the second PA 150, depending on whether the transmitter is operating in a constant envelope modulation mode or a variable envelope modulation mode.

The two fixed divide-by-2 blocks 132 and 134 of the PLL 122 allows the synthesizer to easily generate in-phase (I) and quadrature (Q) carrier signals in four different GSM bands, namely the bands around 850 MHz, 900 Mhz, 1800 Mhz, and 1900 MHz, by tuning the VCO 130 appropriately around 3.6 GHz. RF output signals in the DCS/PCS bands are produced using the first divide-by-2 block 132, while RF output signals in the GSM850/900 band are produced using both divide-by-2 blocks 132 and 134. It should be noted that without the two fixed divide-by-2 blocks 132 and 134, two separate VCOs 130 would have to be employed to support the wide range of frequency tuning. In addition, the outputs from both of the first divide-by-two block 134 and the second divide-by-two block 132 are input to a 4×2 MUX 152 that selects the I and Q signals 81 appropriate for the communications standard being employed.

Figure 11:
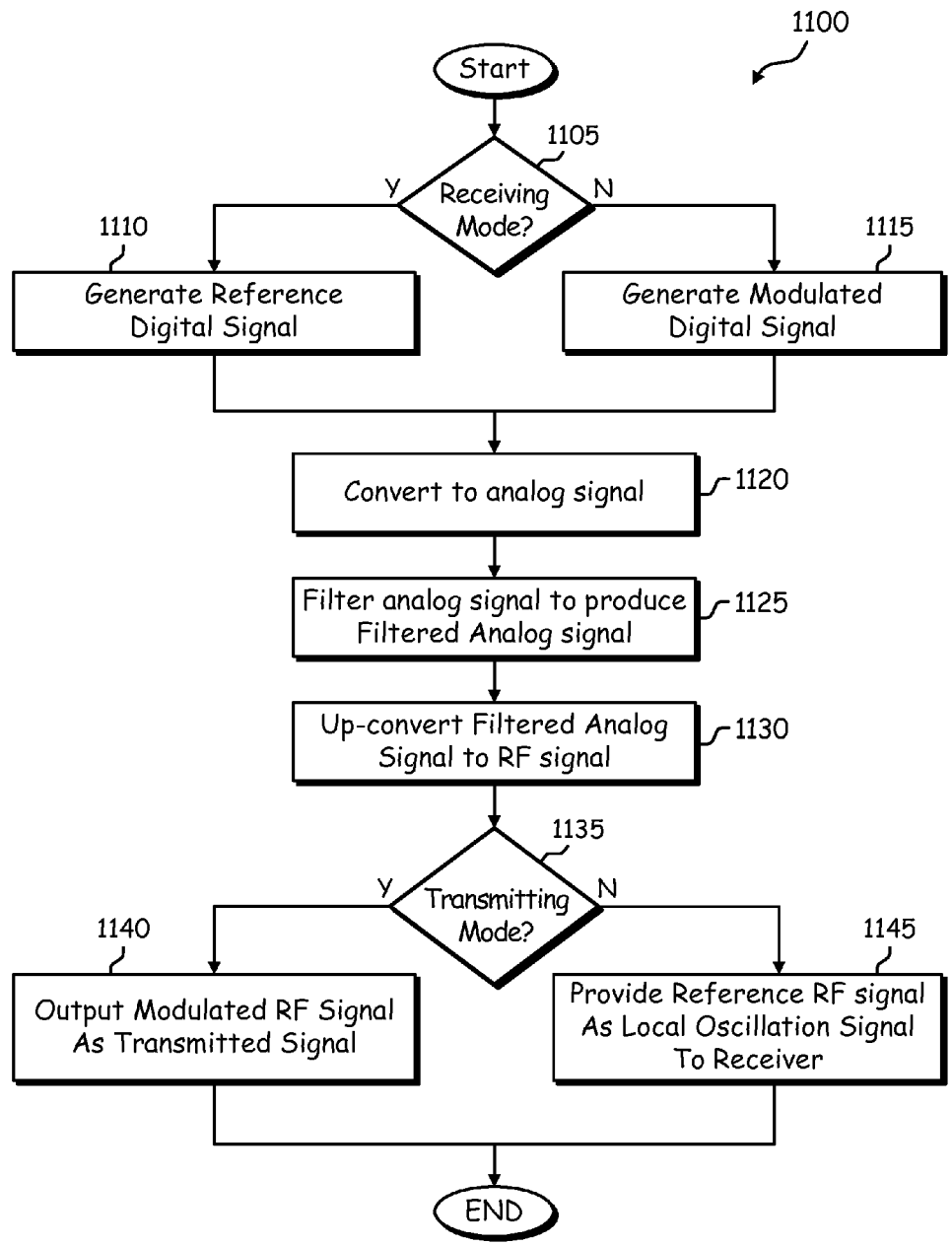
FIG. 11 is a flowchart illustrating one method of the present invention.

FIG. 11 is a flowchart illustrating one method 1100 of the present invention for operating a dual-use PLL frequency synthesizer. Initially, a determination is made whether the transceiver is currently in transmitting mode or in receiving mode (step 1105). If the transceiver is in receiving mode, the digital processor generates a reference digital signal at the appropriate frequency for providing an accurate local oscillation signal for mixing with the inbound RF signal in the receiver (step 1110). However, if the transceiver is in transmitting mode, the digital processor modulates outgoing digital data to generate a modulated digital signal (step 1115). Thereafter, the digital signal (reference or modulated) is converted to an analog reference signal (step 1120), and filtered (step 1125) to remove any digital images present in the analog reference signal. The filtered analog signal is up-converted to an output RF signal using a translational loop (step 1130).

Thereafter, a determination is made again whether the transceiver is currently in transmitting mode or in receiving mode (step 1135). If the transceiver is in transmitting mode, the output RF signal is a modulated RF signal provided to the antenna for transmission (step 1140). However, if the transceiver is in receiving mode, the output RF signal is a reference RF signal (e.g., local oscillation signal) for mixing with the inbound RF signal in the receiver (step 1145)

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A transmitter, comprising:
 a frequency synthesizer coupled to receive outbound transmit data and operable to modulate the outbound transmit data to produce a modulated RF signal; and
 a power amplifier coupled to the frequency synthesizer and operable to amplify the modulated RF signal to produce an outbound RF signal, wherein the frequency synthesizer further includes:
 a digital processor coupled to receive the outbound transmit data and operable to modulate the outbound transmit data to produce a modulated digital signal;
 a Digital-to-Analog Converter (DAC) coupled to receive the modulated digital signal and operable to convert the modulated digital signal to a modulated analog signal;
 a low pass filter coupled to receive the modulated analog signal and operable to filter the analog signal to produce a filtered modulated analog signal; and
 a phase locked loop coupled to receive the filtered modulated analog signal to up-convert the filtered modulated analog signal to the modulated RF signal.

2. The transmitter of claim 1, wherein the digital processor includes:
 a digital modulator coupled to receive the outbound transmit data and operable to digitally modulate the outbound transmit data to produce modulated digital data;
 a summation node connected to receive a reference frequency value and the modulated digital data and operable to combine the reference frequency value with the modulated digital data to produce a combined signal.

3. The transmitter of claim 2, wherein the digital processor further includes:
 a phase accumulator coupled to receive the combined signal and operable to generate a phase signal corresponding to the combined signal; and
 a modulator coupled to receive the phase signal and operable to modulate the phase signal to produce a complex digital signal.

4. The transmitter of claim 3, wherein the modulator is a coordinate rotation digital computer (CORDIC) module.

5. The transmitter of claim 3, wherein the digital processor further includes a dual-notch re-quantizer coupled to receive a portion of the complex digital signal and operable to re-quantize the portion of the complex digital signal to produce the modulated digital signal.

6. The transmitter of claim 1, wherein the phase locked loop includes:
 a phase and frequency detector coupled to receive the filtered modulated analog signal and a feedback signal and operable to produce an error signal indicative of a difference in phase or frequency between the filtered modulated analog signal and the feedback signal;

a charge pump coupled to receive the error signal and generate a current pulse proportional to the error signal; and a loop filter coupled to receive the current pulse and operable to filter the current pulse to produce a control voltage.

7. The transmitter of claim 6, wherein the phase locked loop further includes:

a voltage controlled oscillator coupled to receive the control voltage and operable to track the phase of the modulated digital signal based on the control voltage to produce the feedback signal as the modulated RF signal; and a frequency divider coupled to receive the feedback signal and divide the feedback signal by an integer divide ratio;

wherein the feedback signal generated by the voltage controlled oscillator is the modulated RF signal having a frequency equal to the product of the frequency of the filtered modulated analog signal and the divide ratio.

8. The transmitter of claim 7, wherein the phase locked loop further includes:

a divide-by-two frequency divider coupled to receive the feedback signal from the voltage controlled oscillator and operable to produce the modulated RF signal.

9. The transmitter of claim 8, wherein the modulated digital signal includes an envelope signal and a phase signal, the phase signal being input to the phase locked loop, and wherein the divide-by-two frequency divider includes a first divide-by-two frequency divider coupled to receive the feedback signal from the voltage controlled oscillator and operable to produce a first RF signal and a second divide-by-two frequency divider coupled to receive the first RF signal and operable to produce a second RF signal.

10. The transmitter of claim 9, wherein the frequency synthesizer further comprises:

a first power amplifier coupled to receive the first RF signal and operable to produce the modulated RF signal from the first RF signal and an envelope signal generated by the digital processor; and a second power amplifier coupled to receive the second RF signal and operable to produce the modulated RF signal from the second RF signal and the envelope signal.

11. A method for operating a transmitter, comprising:

receiving outbound transmit data at a frequency synthesizer;

modulating the outbound transmit data, by the frequency synthesizer, to produce an outbound modulated RF signal; and amplifying the outbound modulated RF signal to produce an outbound RF signal, wherein the modulating the outbound transmit data to produce the outbound modulated RF signal further comprises:

modulating the outbound transmit data to produce a modulated digital signal, the modulated digital signal including a digital envelope signal and a digital phase signal;

converting the digital envelope signal and the digital phase signal to an analog envelope signal and an analog phase signal, respectively;

filtering the analog envelope signal and the analog phase signal to produce a filtered analog envelope signal and a filtered analog phase signal, respectively;

up-converting the filtered analog phase signal to an RF signal; and combining the RF signal with the filtered analog envelope signal to produce the outbound modulated RF signal.

12. The method of claim 11, wherein the modulating the outbound transmit data to produce the modulated RF signal further comprises:

modulating the outbound transmit data to produce a modulated digital signal;

converting the modulated digital signal to a modulated analog signal;

filtering the analog signal to produce a filtered modulated analog signal; and up-converting the filtered modulated analog signal to the modulated RF signal.

13. The method of claim 12, wherein the modulating the outbound transmit data to produce the modulated digital signal further comprises:

digitally modulating the outbound transmit data to produce modulated digital data; and combining the modulated digital data with a reference frequency value to produce a combined signal.

14. The method of claim 12, wherein the modulating the outbound transmit data to produce the modulated digital signal further comprises:

generating a phase signal corresponding to the combined signal; and modulating the phase signal to produce a complex digital signal.

15. The method of claim 14, wherein the modulating the outbound transmit data to produce the modulated digital signal further comprises:

re-quantizing a portion of the complex digital signal to produce the modulated digital signal.

16. The method of claim 12, wherein the up-converting the filtered modulated analog signal to the modulated RF signal further comprises:

receiving the filtered modulated analog signal and a feedback signal;

producing an error signal indicative of a difference in phase or frequency between the filtered modulated analog signal and the feedback signal;

generating a current pulse proportional to the error signal;

filtering the current pulse to produce a control voltage; and tracking the phase of the modulated digital signal based on the control voltage to produce the feedback signal as the outbound modulated RF signal.

17. The method of claim 11, wherein the up-converting the filtered analog phase signal to the RF signal further comprises:

producing a first RF signal from a first divide-by-two block; and producing a second RF signal from the first RF signal and from a second divide-by-two block.

18. The method of claim 17, wherein the combining the RF signal with the filtered analog envelope signal to produce the outbound modulated RF signal further comprises:

producing a first modulated RF signal from the first RF signal and the filtered analog envelope signal;

producing a second modulated RF signal from the second RF signal and the filtered analog envelope signal; and selecting one of the first modulated RF signal and the second modulated RF signal as the modulated RF signal.

* * * * *